United States Patent
Besser et al.

(10) Patent No.: US 7,595,257 B2
(45) Date of Patent: Sep. 29, 2009

(54) PROCESS OF FORMING AN ELECTRONIC DEVICE INCLUDING A BARRIER LAYER

(75) Inventors: Brant D. Besser, Mesa, AZ (US); David C. Burdeaux, Phoenix, AZ (US); Michael L. Kottke, Fountain Hills, AZ (US); Jean B. Martin, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 170 days.

(21) Appl. No.: 11/508,610

(22) Filed: Aug. 22, 2006

(65) Prior Publication Data

US 2008/0048177 A1    Feb. 28, 2008

(51) Int. Cl.
*H01L 21/30*    (2006.01)

(52) U.S. Cl. .................. 438/459; 257/31; 257/341; 257/342; 257/343; 257/690; 438/13

(58) Field of Classification Search .............. 257/31, 257/341, 342, 343, 690; 438/13, 459
See application file for complete search history.

(56) References Cited

U.S. PATENT DOCUMENTS

| | | | | |
|---|---|---|---|---|
| 4,176,443 A | * | 12/1979 | Iannuzzi et al. | 438/106 |
| 4,772,935 A | * | 9/1988 | Lawler et al. | 257/751 |
| 4,946,376 A | * | 8/1990 | Sharma et al. | 428/620 |
| 5,119,159 A | * | 6/1992 | Hoshi | 257/328 |
| 5,360,765 A | * | 11/1994 | Kondo et al. | 438/656 |
| 5,397,716 A | * | 3/1995 | Anderson | 438/138 |
| 5,958,796 A | * | 9/1999 | Prall et al. | 438/694 |
| 6,140,703 A | * | 10/2000 | Cronin et al. | 257/766 |
| 6,242,288 B1 | * | 6/2001 | Francis et al. | 438/138 |
| 6,294,395 B1 | * | 9/2001 | Birdsley et al. | 438/14 |
| 6,787,435 B2 | * | 9/2004 | Gibb et al. | 438/507 |
| 2008/0044952 A1 | * | 2/2008 | Kudoh et al. | 438/123 |

FOREIGN PATENT DOCUMENTS

GB    1248137    12/1969

OTHER PUBLICATIONS

"Chapter 7: MOS Field-Effect-Transistors," B. Van Zeghbroeck, 2004, printed from http://ece-www.colorado.edu/~bart/book/book/chapter7/ch7_8.htm on Aug. 22, 2006, 3 pages.

* cited by examiner

*Primary Examiner*—David Vu
*Assistant Examiner*—Brandon Fox

(57) ABSTRACT

An electronic device can include a substrate (12) having a primary surface (14), a second surface (16, 22) opposite the primary surface (14), and an electrode (50). In one embodiment, the electrode (50) can lie adjacent to the second surface (22) and include, a barrier layer (54) lying between a conductive layer (56) and a metal-containing layer (52), wherein the metal-containing layer (52) includes a first metallic element and not a second metal element, and the barrier layer (54) includes the second metal element and not the first metallic element. In another embodiment, an adhesion layer (52) and a conductive layer (56) can each include a metallic element, and lie immediately adjacent to a barrier layer (54). In still another embodiment, a process for forming an electronic device can include removing a portion of the substrate (12) opposite a primary surface (14).

18 Claims, 3 Drawing Sheets

PROCESS OF FORMING AN ELECTRONIC DEVICE INCLUDING A BARRIER LAYER

BACKGROUND

1. Field of the Disclosure

The present disclosure relates to electronic devices, more particularly, to electronic devices that have electrodes including barrier layers and processes for forming them.

2. Description of the Related Art

A low resistance electrical connection with high physical strength between a substrate and a package is important in electronic devices, especially those that are designed to operate at relatively high power or current conditions. A barrier layer of titanium, followed by a solderable layer of nickel or nickel vanadium, further followed by an oxidation-resistant layer of gold are added to the back of the substrate to form an electrode to lower the resistance of the connection between the substrate and the package.

However, insulating material, such as a native oxide or other residual material from previous processing lying between the back of the substrate and the barrier layer can cause unacceptably high resistance between the substrate and the package. One attempt to improve the electrical connection is to sputter etch the back of the substrate with argon to remove any such layers prior to forming the electrode. Removing the insulating material using argon can improve the electrical connection, but the physical connection between the metal layer and the substrate can be compromised such that the electrode would peel during a conventional tape test.

One attempt to improve the physical connection is to vent the chamber to atmosphere so that a native oxide forms on the substrate and acts as an adhesion layer for the electrode. The native oxide can also increase the resistance between the substrate and the package. Forming the native oxide layer can also require that a subsequent process step be performed at a temperature of 380 C or higher, such as when a die previously singulated from the substrate is mounted on the package. Another attempt is to bake the substrate after the sputter-etch at a temperature of about 380 C or greater prior to forming the barrier layer of the electrode. This may not be practical in a piece of etch or deposition equipment that is not factory-equipped with heat control in the deposition chamber. Replacement of such a piece of etch or deposition equipment is expensive and may require requalification of existing products.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
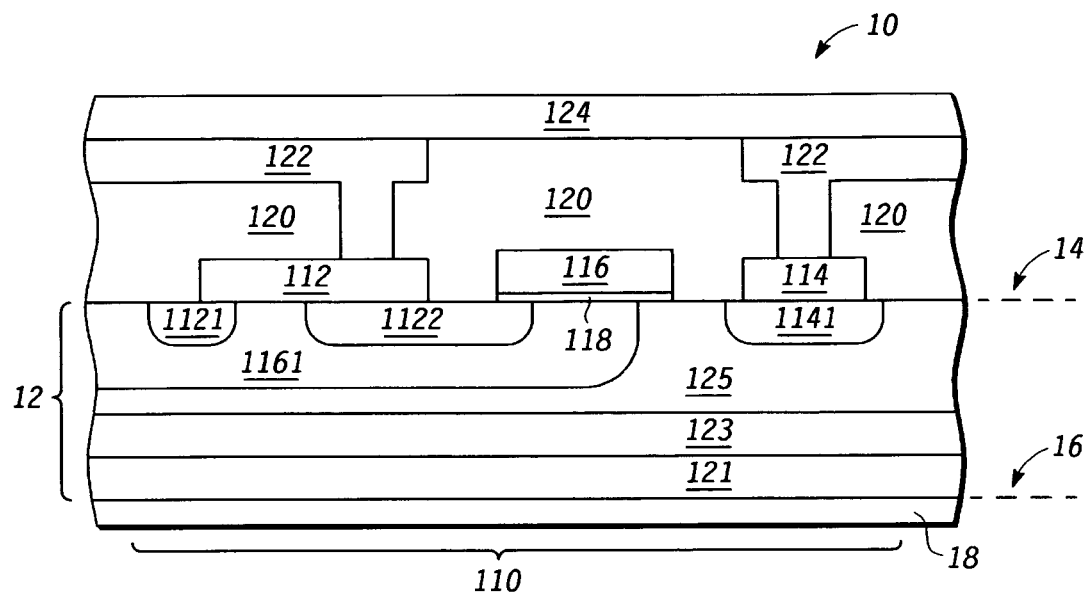
FIG. 1 includes an illustration of a cross-sectional view of a portion of a workpiece including a primary surface.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments described herein. The use of the same reference symbols in different drawings indicates similar or identical items.

DETAILED DESCRIPTION

An electronic device can include a substrate including a primary surface, a second surface opposite the primary surface, and an electrode. In one embodiment, the electrode lies adjacent to the second surface. The electrode can include, a conductive layer, and a barrier layer lying between the conductive layer and the second surface of the substrate. The electrode can also include a metal-containing layer lying between the barrier layer and the second surface of the substrate. The metal-containing layer can include a first metallic element and not a second metal element, and the barrier layer can include the second metal element and not the first metallic element.

In another embodiment, a process for forming an electronic device can include removing a portion of the substrate opposite the primary surface to form the second surface, and forming an adhesion layer adjacent to the second surface. The process can also include forming a barrier layer adjacent to the adhesion layer, and forming a conductive layer adjacent to the barrier layer, wherein an electrode includes the adhesion layer, the barrier layer, and the conductive layer.

In still another embodiment, the electrode can include a first conductive layer having a first composition including a metallic element. The electrode can also include a second conductive layer lying closer to the substrate than the first conductive layer and having a second composition including the metallic element. The electrode can further include a barrier layer lying between the first conductive layer and the second conductive layer, wherein each of the first conductive layer and the second conductive layer is immediately adjacent to the barrier layer.

In accordance with a particular embodiment, an electrode is formed with an adhesion layer between a remainder of the electrode and the substrate. The electrode provides an improved physical and electrical connection between a substrate and a package on which the substrate is mounted. Additionally, the quality of the electrical connection provided by the electrode is independent of the temperature of the mount process. Specific embodiments of the present disclosure will be better understood with reference to FIGS. 1 through 6.

Some terms are defined or clarified as to their intended meaning as they are used within this specification.

The term "primary surface" is intended to mean a surface of a substrate from which electronic components can be formed. The primary surface may be an original surface of a substrate before forming any electronic components. For example, the electronic components may be formed at least partly within an epitaxial layer overlying a base material. In this example, the primary surface refers to the upper surface of the epitaxial layer, and not the original surface of the base material.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes an illustration of a cross-sectional view of a portion of a workpiece 10. In the illustrated embodiment, the workpiece 10 includes a substrate 12, an insulating layer 120, an interconnect 122 and an encapsulating layer 124. Substrate 12 includes a semiconductor element such as silicon, germanium, another semiconductor element, or any combination thereof. Substrate 12 has an n-type region, a p-type region or a combination thereof. The substrate 12 also has a primary surface 14 from which an electronic component 110 of the electronic device is formed. In one embodiment, the electronic device includes a vertical metal oxide semiconductor ("MOS") component, a planar MOS component, a fin-type MOS component, or any combination thereof. The substrate 12 also has an opposing surface 16, opposite the primary surface 14. An insulating layer 18 lies adjacent the opposing surface 16. The insulating layer 18 includes an oxide, a nitride, an oxinitride, or any combination thereof. In one embodiment, the insulating layer 18 is a native oxide. In another embodiment, the insulating layer 18 includes a material deposited while performing a previous conventional or proprietary formation process for a layer over the primary surface 14 as illustrated in FIG. 1.

In embodiment of FIG. 1, the electronic component 110 is illustrated as a laterally diffused metal oxide semiconductor ("LDMOS") transistor structure. The electronic component 110 includes a source electrode 112, a drain electrode 114, a gate electrode 116, and a gate dielectric layer 118 lying between the gate electrode 116 and the substrate 12. The electronic component 110 also includes a body contact region 1121, a source region 1122, a drain region 1141, and a channel region 1161. In one embodiment, the substrate 12 further includes a heavily doped region 121, a lightly doped region 123 and a doped region 125. The heavily doped region 121 and the lightly doped region 123 have an opposite doping type as compared to the doped region 125. In another embodiment, the electronic component 110 includes another power MOS field effect transistor ("power MOSFET"), such as a v-shaped MOS ("VMOS") or a u-shaped MOS ("UMOS") transistor, or an insulated gate bipolar transistor ("IGBT") structure.

Referring to FIG. 1, the insulating layer 120, the interconnect 122 and the encapsulating layer 124 are formed of appropriate semiconductor materials using a conventional or proprietary technique. Although not illustrated, the interconnect 122 can lie exposed within an opening in the encapsulating layer 124 such that an electrical connection can be made between the interconnect 122 and another conductive member (not illustrated).

Figure 2:
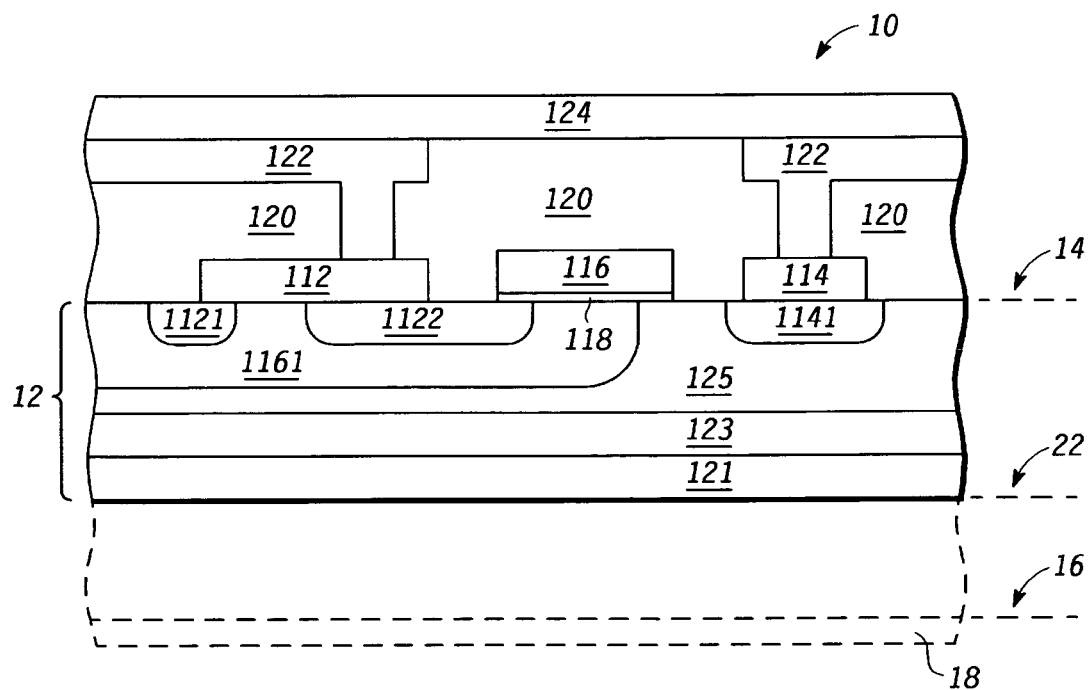
FIG. 2 includes an illustration of a cross-sectional view of the portion of the workpiece of FIG. 1 after removing a portion of the substrate.

FIG. 2 includes an illustration of a cross-sectional view of the workpiece 10 after forming a second surface 22 opposite the primary surface 14. The insulating layer 18 and a portion of the substrate 12 are removed from the opposing surface 16 to form the second surface 22 using a conventional or proprietary process. In one embodiment, the workpiece 10 is back lapped. In another embodiment the workpiece 10 is thinned by exposing the opposing surface 16 to a plasma. In one embodiment, greater than approximately 60 microns of material are removed from the substrate 12. In another embodiment greater than approximately 150 microns of material are removed from the substrate 12. In a particular embodiment, greater than approximately 300 microns are removed from the opposing surface 16 of the substrate 12.

A thickness of the remaining portion of substrate 12 is substantially the same as the shortest distance between the primary surface 14 and the second surface 22. In one embodiment, the thickness of the remaining portion of the substrate 12 is less than approximately 500 microns. In another embodiment, the thickness of the remaining portion of the substrate 12 is less than approximately 250 microns. In a particular embodiment, the thickness of the remaining portion of the substrate 12 is in a range of approximate 100 microns to approximately 150 microns.

Figure 3:
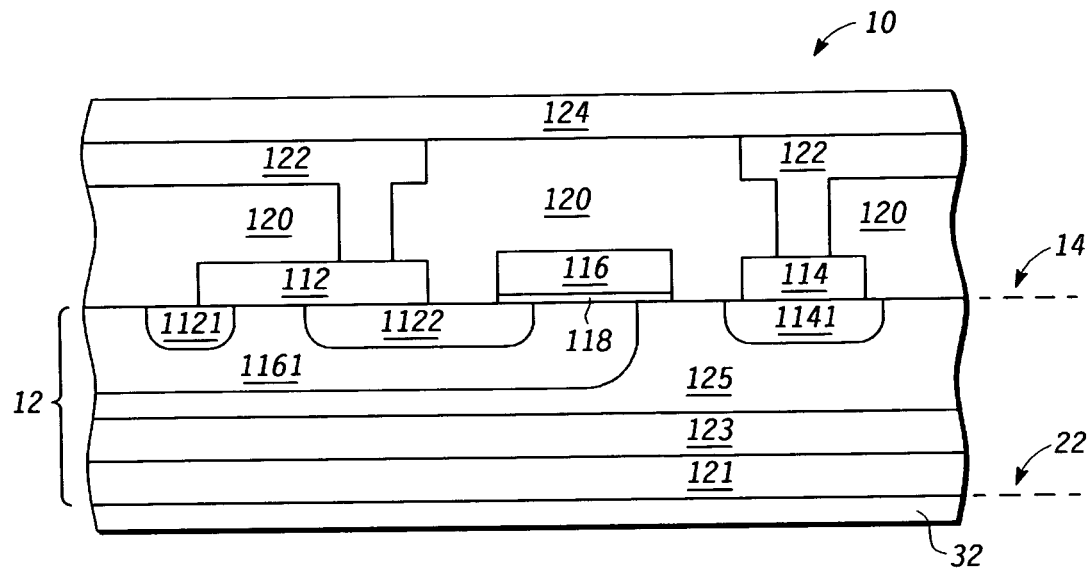
FIG. 3 includes an illustration of a cross-sectional view of the workpiece of FIG. 2 after forming an insulating layer.

FIG. 3 includes an illustration of a cross-sectional view of the workpiece 10 after exposure to atmospheric conditions. In one embodiment, after formation of the second surface 22, the workpiece 10 is exposed to atmospheric or other conditions, and an insulating layer 32 forms along exposed portions of the second surface 22. In another embodiment, the insulating layer 32 includes oxygen, nitrogen, or any combination thereof. In a particular embodiment, the insulating layer 32 includes a native oxide.

Figure 4:
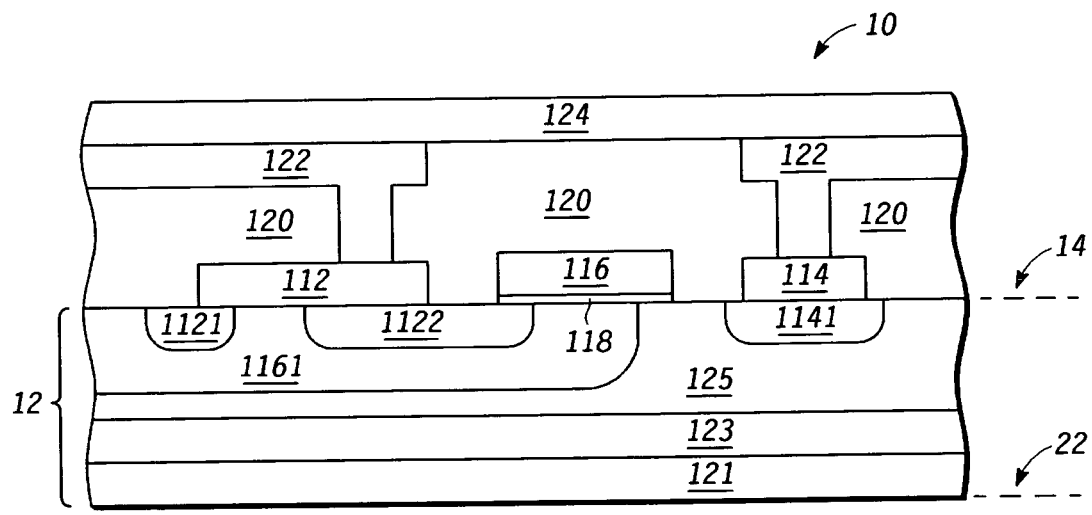
FIG. 4 includes an illustration of a cross-sectional view of the workpiece of FIG. 3 after removing the insulating layer.

FIG. 4 includes an illustration of a cross-sectional view of the workpiece 10 after removing the insulating layer 32 using a conventional or proprietary process. In one embodiment, a vacuum is formed and a conventional or proprietary argon sputter etch is used to remove the insulating layer 32. In another embodiment, such a process is performed without temperature control for the substrate.

Figure 5:
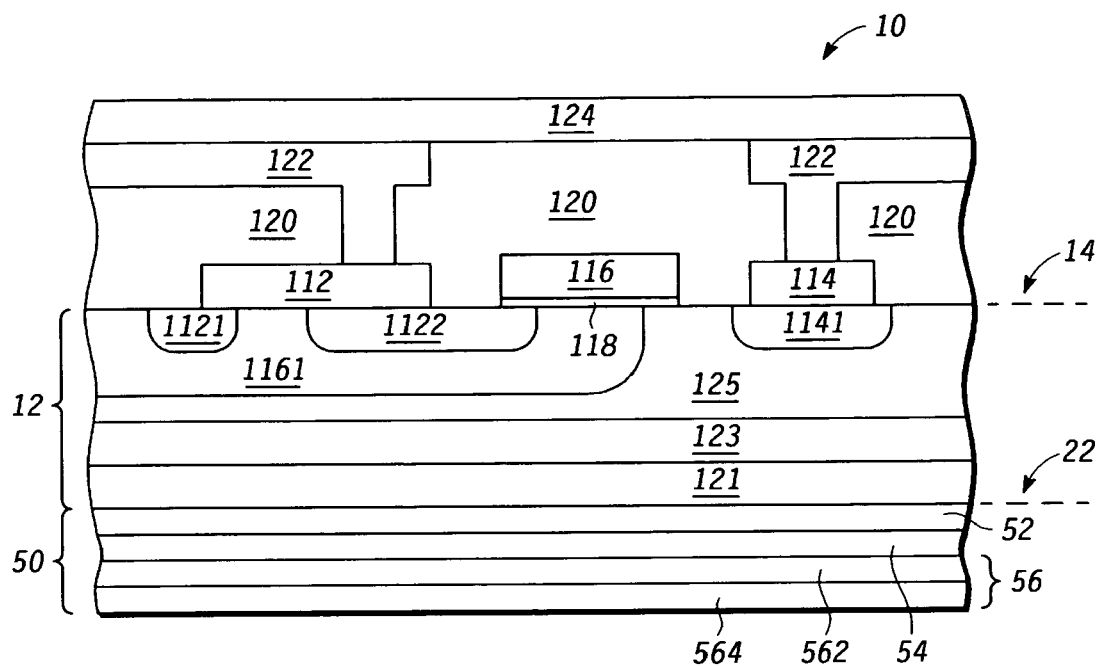
FIG. 5 includes an illustration of a cross-sectional view of the workpiece of FIG. 4 after forming an electrode adjacent to a second surface of the substrate, opposite the primary surface of the substrate.

FIG. 5 includes an illustration of a cross-sectional view of the workpiece 10 after forming an electrode 50 adjacent to the second surface 22 using a conventional or proprietary deposition process. In one embodiment, the electrode 50 includes an adhesion layer 52, a barrier layer 54, and a conductive layer 56. In a particular embodiment, the conductive layer 56 further includes a solderable layer 562 and an oxidation-resistant layer 564.

In the embodiment illustrate in FIG. 5, the adhesion layer 52 lies between the barrier layer 54 and the second surface 22 and has a thickness in a range of approximately 0.5 to approximately 50 nm. In a particular embodiment, the adhesion layer 52 has a thickness in a range of approximately 25 nm to approximately 50 nm. The adhesion layer 52 is the layer of the electrode 50 that is closest to the second surface 22. The adhesion layer 52 is deposited using a chemical vapor deposition ("CVD") process, a physical vapor deposition ("PVD") process, or any combination thereof. In one embodiment, the adhesion layer 52 is a conductive layer. In a particular embodiment, the adhesion layer 52 contains a metallic element. In a more particular embodiment, the metallic element combines with the exposed substrate such that an alloy or metal-semiconductor material begins to form at a temperature of not greater than approximately 280 C. In an even more particular embodiment, the adhesion layer 52 includes Ni, Al, Au, V, Cu, or any combination thereof.

Also in the embodiment illustrated in FIG. 5, the barrier layer 54 lies between the conductive layer 56 and the second surface 22 and has a thickness in a range of approximately 10 to approximately 100 nm. In one embodiment, the barrier layer 54 lies between and immediately adjacent to both the adhesion layer 52 and the conductive layer 56. The barrier layer 54 is deposited using a CVD process, a PVD process, or any combination thereof. In another embodiment, the barrier layer 54 substantially prevents diffusion of a metallic element from an immediately adjacent layer to another immediately adjacent layer during a subsequently preformed annealing process of up to approximately 500 C In yet another embodiment, the barrier layer 54 includes a metallic element. In a particular embodiment, the barrier layer 54 includes Ti, Ta, W, Pt, Pd, Cr, or any combination thereof. In a more particular embodiment, the barrier layer includes Ti. In another particular embodiment, the barrier layer 54 includes a metallic element not present in the adhesion layer 52; the adhesion layer 52 includes a metallic element not present in the barrier layer 54; or any combination thereof. In another embodiment, the substrate temperature does not exceed approximately 280 C subsequent to forming the second surface and prior to forming the barrier layer 54.

Further, in the embodiment illustrated in FIG. 5, the conductive layer 56 lies adjacent to the barrier layer 54. The conductive layer 56 is formed using a CVD process, a PVD process, a plating process, or any combination thereof. The conductive layer 56 includes a metallic element such as any of those previously described for the adhesion layer 52. In one embodiment, the conductive layer 56 includes the same metallic element as the adhesion layer 52. In a particular embodiment, the solderable layer 562 of the conductive layer 56 is formed immediately adjacent to the barrier layer 54 and has a thickness in a range of approximately 100 to approximately 600 nm, and the oxidation-resistant layer 564 of the conductive layer 56 is formed adjacent to the solderable layer 562 and substantially prevents subsequent exposure of the solderable layer 562 to an atmosphere. The oxidation-resistant layer 564 has a thickness in a range of approximately 15 to approximately 150 nm. In a more particular embodiment, the solderable layer 562 includes Ni, V, Ag, or any combination thereof. In another more particular embodiment, the oxidation-resistant layer 564 includes Au, Ag, Pt, Pd, or any combination thereof. In a still more particular embodiment, the oxidation-resistant layer 564 is a sacrificial layer such that at a subsequent point in the process, the oxidation-resistant layer 564 may be removed to expose the surface of the solderable layer 562. In another embodiment, the oxidation-resistant layer 564 may remain substantially in place during the remainder of the processing.

In a particular embodiment, the process flow described with respect to FIGS. 4 and 5 is performed in a sputtering tool capable of performing both sputter etching and deposition processes without breaking vacuum. By performing the process flow in such a tool, a significant saving in process time is achieved over processes that require breaking vacuum. Additionally, by limiting the exposure of the workpiece 10 to oxygen during forming the electrode 50, the total resistance of the subsequently completed electronic device is lowered by forming fewer oxygen-containing materials within or adjacent to the electrode 50. Also, by substantially eliminating the need to perform an anneal process prior to the barrier deposition; the process can be performed in a wider variety of process tools. In another embodiment, the vacuum is broken after formation of the adhesion layer 52, after the formation of the barrier layer 54, after formation of the solderable layer 562, after the formation of the oxidation-resistant layer 564, or any combination thereof. In such a case, an additional vacuum formation process, additional insulating layer removal process, or any combination thereof may be performed.

Figure 6:
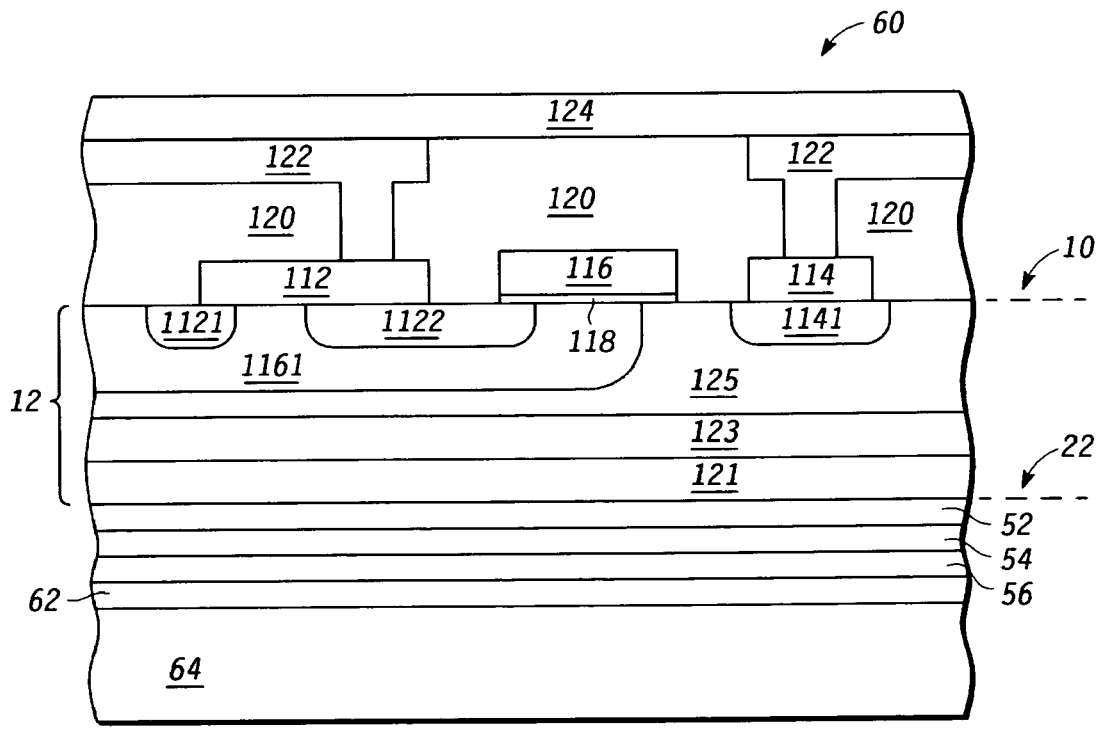
FIG. 6 includes an illustration of a cross-sectional view of the workpiece of FIG. 5 after mounting on a package.

FIG. 6 includes an illustration of a cross-sectional view of a substantially completed electronic device. The workpiece 10 is singulated to form a die 60 and is mounted to a package 64. In another embodiment, a mounting layer 62 may or may not be used during the process of bonding the die 60 to the package 64. In the illustrated embodiment, the mounting layer 62 is formed by a conventional or proprietary process and is used to affix the die 60 to the package 64. The mounting layer 62 includes a conventional or proprietary conductive material with the appropriate properties and forms the electrical connection between the die 60 and the package 64. The mounting layer 62 is a solder, paste, glue, epoxy, perform, or any combination thereof and is applied to the die 60 or the package 64 prior to attaching the die 60 and the package 64 together. The package 64 is any conventional or proprietary package type designed to attach to the electrode 50. In a particular embodiment, the electronic device includes a power MOS component in a plastic package. In one embodiment, during the mounting process, the oxidation resistant layer 564 dissolves or is otherwise removed such that a connection is made to the solderable layer 562. A resistance between the die 60 and the package 64, as measured across the electrode 50, is less than 10% of the total resistance of the electronic component 110 of the die 60. In one embodiment, the resistance of the electrode 50 is less than approximately 10 milliohms. In another embodiment, the resistance of the electrode 50 is less than approximately 1 milliohm. In a particular embodiment, the resistance of the electrode 50 is substantially independent of the temperature of the substrate during or after bonding the die to the package. In another embodiment, the mounting process is performed at less than 500 C and acts as an anneal process for the die 60.

Thus, the electrode 50 is formed along the second surface 22 of the substrate 12, wherein the electrode 50 includes the adhesion layer 52, the barrier layer 54, and the conductive layer 56. A connection between the die 60 and the package 64 via the electrode 50 is formed having both a relatively high physical strength and relatively low resistivity compared a connection formed with an electrode formed with a different structure. Such improvement is particularly important with respect to a power device in a plastic package or another high-current device in a same or different package. Additionally, the time to perform the process, the complexity of the equipment to perform the process, or any combination thereof also is reduced compared to a current process flow.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate including, a primary surface, a second surface opposite the primary surface. The electronic device can also include an electrode adjacent to the second surface. The electrode can include a conductive layer, and a barrier layer lying between the conductive layer and the second surface of the substrate. The electrode can also include a metal-containing layer lying between the barrier layer and the second surface of the substrate, wherein the metal-containing layer includes a first metallic element and not a second metal element, and the barrier layer includes the second metal element and not the first metallic element.

In one embodiment of the first aspect, the primary surface and the second surface are substantially parallel to each other, and a distance from the primary surface to the second surface is less than approximately 500 microns. In another embodiment, the electronic device can further include a package, wherein a resistance between the substrate and the package portion across the electrode is not greater than approximately 1 milliohm. In still another embodiment, each of the conductive layer and the metal-containing layer includes the first metallic element.

In a particular embodiment of the first aspect, the first metallic element includes Ni, and the barrier layer includes Ti. In another particular embodiment, the conductive layer of the electrode further includes, an oxidation-resistant layer, and a solderable layer between the barrier layer and the oxidation-resistant layer, wherein the solderable layer includes the first metallic element. In another embodiment, an LDMOS transistor lies adjacent to the primary surface.

In a second aspect, a process for forming an electronic device can include providing a substrate including a primary surface, and removing a portion of the substrate opposite the primary surface to form a second surface. The process can also include forming an adhesion layer adjacent to the second surface, and forming a barrier layer adjacent to the adhesion layer. The process can further include forming a conductive layer adjacent to the barrier layer, wherein an electrode includes the adhesion layer, the barrier layer, and the conductive layer.

In one embodiment of the second aspect, removing the portion of the substrate removes not less than approximately 60 micron of a thickness of the substrate. In another embodiment, the process can further include removing an insulating layer from the second surface prior to forming the adhesion layer. In a particular embodiment, the process can further include forming a vacuum surrounding the substrate prior to removing the insulating layer from the second surface, wherein forming the adhesion layer, forming the barrier layer, and forming the conductive layer are all performed without breaking the vacuum.

In another embodiment of the second aspect, the substrate temperature is not greater than approximately 280 C subsequent to removing a portion of the substrate opposite the primary surface to form a second surface and prior to forming the barrier layer of the electrode. In yet another embodiment, forming the adhesion layer includes forming the adhesion layer including Ni, Al, Au, V, Cu, or any combination thereof. In still another embodiment, forming the barrier layer includes forming the barrier layer including Ti, Ta, W, Pt, Pd, Cr, or any combination thereof.

In another embodiment of the second aspect, forming the adhesion layer and forming the conductive layer are performed such that the adhesion layer and the conductive layer each contain a same metallic element. In a particular embodiment, the process can further include annealing the substrate after forming the barrier layer at a temperature of up to approximately 380 C, wherein substantially none of the same metallic element diffuses across the barrier layer. In still another embodiment of the second aspect, the process can further include singulating the substrate to form a die, and bonding the die to a package at a temperature less than approximately 380 C.

In a third aspect, an electronic device can include a substrate including a primary surface, a second surface opposite the primary surface, and an electrode adjacent to the second surface. The electrode can include a first conductive layer having a first composition including a metallic element, and a second conductive layer lying closer to the substrate than the first conductive layer and having a second composition including the metallic element. The electrode can also include a barrier layer lying between the first conductive layer and the second conductive layer, wherein each of the first conductive layer and the second conductive layer is immediately adjacent to the barrier layer.

In one embodiment of the third aspect, the metallic element includes Ni, Al, Au, V, Cu, or any combination thereof, and the barrier layer includes Ti, Ta, W, Pt, Pd or any combination thereof. In another embodiment, the metallic element includes Ni, and the barrier layer includes Ti.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process for forming an electronic device comprising:
    providing a substrate including a primary surface and an opposing surface, wherein the substrate is a semiconductor substrate, and wherein a first insulating layer lies along the opposing surface;
    removing the first insulating layer and a portion of the substrate opposite the primary surface to form a second surface;
    forming a second insulating layer along the second surface of the substrate;
    forming an adhesion layer adjacent to the second surface after forming the second insulating layer;

forming a barrier layer adjacent to and after forming the adhesion layer; and forming a solderable layer adjacent to and after forming the barrier layer; and forming an oxidation-resistant layer adjacent to and after forming the solderable layer, wherein the oxidation-resistant layer has a composition different from the solderable layer, and an electrode includes the adhesion layer, the barrier layer, the solderable layer, and the oxidation-resistant layer.

2. The process of claim 1, wherein the substrate temperature is not greater than approximately 280 C subsequent to removing a portion of the substrate opposite the primary surface to form a second surface and prior to forming the barrier layer of the electrode.

3. The process of claim 2, wherein forming the adhesion layer comprises forming the adhesion layer including Ni, Al, Au, V, Cu, or any combination thereof.

4. The process of claim 1, wherein forming the adhesion layer and forming the solderable layer are performed such that the adhesion layer and the solderable layer are immediately adjacent to and lie on opposite sides of the barrier layer, and each of the adhesion layer and the solderable layer contain a same metallic element.

5. The process of claim 4, further comprising annealing the substrate after forming the barrier layer at a temperature of up to approximately 380 C, wherein substantially none of the same metallic element diffuses across the barrier layer.

6. The process of claim 1, further comprising:

singulating a workpiece to form a die that includes a portion of the substrate; and mounting the die to a package, wherein the electronic device includes the die and the package.

7. The process of claim 6, wherein mounting the die to the package is performed such that a resistance between the portion of the substrate and the package portion across the electrode is not greater than approximately 1 milliohm.

8. The process of claim 1, wherein removing the portion of the substrate comprises back lapping a workpiece, wherein removing is performed to remove at least 60 microns of the substrate.

9. The process of claim 8, further comprising singulating a workpiece to form a die that includes a portion of the substrate, wherein singulating is performed after removing the portion of the substrate, and wherein the die is part of the electronic device.

10. The process of claim 1, wherein removing the portion of the substrate removes not less than approximately 60 micron of a thickness of the substrate.

11. The process of claim 1, wherein forming the barrier layer comprises forming the barrier layer including Ti, Ta, W, Pt, Pd, Cr, or any combination thereof.

12. The process of claim 1, further including:

singulating the substrate to form a die; and bonding the die to a package at a temperature less than approximately 380 C.

13. The process of claim 1, further comprising forming a power transistor adjacent to a primary surface before removing the portion of the substrate.

14. The process of claim 1, further comprising forming an LDMOS transistor adjacent to primary surface before removing the portion of the substrate.

15. The process of claim 1, wherein the solderable layer is thicker than each of the adhesion layer, the barrier layer, and the oxidation-resistant layer.

16. The process of claim 1, further comprising removing the oxidation-resistant layer before mounting the die to the package.

17. The process of claim 1, wherein forming the barrier layer comprises forming the barrier layer such that the barrier layer substantially prevents diffusion of a metallic element from an immediately adjacent layer to another immediately adjacent layer at a temperature up to approximately 500 C.

18. The process of claim 1, wherein:

forming the adhesion layer comprises forming the adhesion layer including Ni, Al, Au, V, Cu, or any combination thereof;

forming the barrier layer comprises forming the barrier layer including Ti, Ta, W, Pt, Pd, Cr, or any combination thereof;

forming the solderable layer comprises forming the conductive layer including Ni, V, Ag, or any combination thereof; and the oxidation-resistant layer comprises forming the oxidation-resistant layer including Au, Ag, Pt, Pd, or any combination thereof.

* * * * *